United States Patent [19]

Dwarakanath et al.

[11] 4,322,687
[45] Mar. 30, 1982

[54] OPERATIONAL AMPLIFIER WITH IMPROVED OFFSET CORRECTION

[75] Inventors: Mirmira R. Dwarakanath, Berkeley Heights; Douglas G. Marsh, Howell Township, Monmouth County, both of N.J.

[73] Assignee: Bell Telephone Laboratories, Incorporated, Murray Hill, N.J.

[21] Appl. No.: 151,534

[22] Filed: May 19, 1980

[51] Int. Cl.³ .............................................. H03F 1/34
[52] U.S. Cl. ....................................... 330/9; 330/259; 330/290
[58] Field of Search ............................ 330/9, 259, 290

[56] References Cited

U.S. PATENT DOCUMENTS 3,617,913  11/1971  Schmidhauser et al. ............. 330/9
3,737,798   6/1973  Faraquet et al. ................... 330/9
4,129,863  12/1978  Gray et al. ................... 340/347 AD

OTHER PUBLICATIONS

Suarez et al. "An All-MOS Charge-Redistribution A/D Conversion Technique" pp. 194–195 IEEE International Solid State Circuit Conference 1974.

Primary Examiner—James B. Mullins
Assistant Examiner—Gene Wan
Attorney, Agent, or Firm—David R. Padnes

[57] ABSTRACT

Improved input offset voltage compensation of an amplifier (12) is achieved through the use of a servo loop which is added to electronic switch and capacitor offset compensation circuitry disposed in the input (14) and feedback (20) paths of the amplifier. A voltage approximately equal to the offset voltage is stored on a feedback capacitor (24) by operation of input reset (34), feedback shunt (22) and feedback reset (26) switches. An error correction voltage is then generated within the servo loop (40) to adjust for the residual offset produced by the operation of the input reset and feedback shunt switches as well as the finite gain of the amplifier.

10 Claims, 4 Drawing Figures

OPERATIONAL AMPLIFIER WITH IMPROVED OFFSET CORRECTION

TECHNICAL FIELD

The present invention relates to operational amplifiers and, more particularly, to circuitry for precisely compensating for input offset voltage.

BACKGROUND OF THE INVENTION

The input offset voltage of an operational amplifier is the differential dc input voltage required to provide a zero output voltage when there is no signal input. Input offset voltage is an inherent source of errors in operational amplifiers which is caused by a number of factors, including lack of symmetry in the differential input stage and lack of precise bias. The severity of the error produced and, therefore, the need for offset compensation circuitry is dependent on the particular operational amplifier application.

A comparator is one application of operational amplifiers. In A/D converters, such as the charge redistribution coder disclosed in U.S. Pat. No. 4,129,863 to Gray et al, issued Dec. 12, 1978, input offset voltage compensation of the comparator is required to minimize idle channel noise and crosstalk enhancement. This enhancement is most acute when the comparator is biased, by accumulated dc offset, at or near a code step boundary. Under this condition, small signal perturbations, such as idle channel noise and crosstalk, are coded as different digital words thereby amplifying the original signal perturbation on decoding. This results in errors in data transmission systems and produces an undesirable audible noise in voice transmission systems. To reduce these errors, the comparator is typically biased or zero set to less than one quarter of an LSB (least significant bit) or ground.

A prior art technique of zero setting a comparator within an A/D converter is through the use of polarity bit feedback. Pursuant to this technique, the sign bit of the encoded signal is used to offset the sampled analog signal to compensate for the average value of input offset voltage. While the use of polarity bit feedback provides satisfactory compensation in many applications, the feedback response is too slow for high speed A/D converters.

In a pending U.S. Pat. application of the present inventors, Ser. No. 111,997, filed Jan. 14, 1980, assigned to the present assignee, and incorporated herein by reference, input offset voltage of an operational amplifier is compensated by using electronic switches and capacitors. An input capacitor is disposed in series with the input signal terminal of the amplifier. A feedback capacitor is located in a loop between the feedback input terminal and the amplifier output terminal. Periodically, the amplifier signal input terminal is grounded by an input reset switch. The output voltage, approximately equal to the offset voltage, is then stored on the feedback capacitor by operation of a feedback shunt switch and a feedback reset switch. These switches shunt or disconnect one side of the feedback capacitor from the feedback loop and connect the second side of the feedback capacitor to ground.

Inherent in the operation of this circuitry are compensation errors caused by the gain of the operational amplifier and by unequal electronic charges injected on the amplifier input terminals by switch operations. While judicious circuit design and manufacture can reduce errors attributable to switch operation, a residual input offset voltage of 2–3 millivolts remains. This residual offset is significant in some operational amplifier applications. In a comparator, such as in the above-cited charge redistribution coder, the maximum signal level can be 3 volts and the least significant bit 600μvolts. Consequently, the comparator must be zero set to less than 150μvolts.

SUMMARY OF THE INVENTION

In accordance with the present invention, improved compensation for the input offset voltage of an operational amplifier is achieved. This improvement results from the addition of a servo loop to the use of electronic switches and capacitors in the input signal and feedback path of the operational amplifier. The servo loop generates an error correction voltage that compensates for errors in input offset voltage compensation caused by operation of the electronic switches, or switch feedthrough effects, as well as the finite gain of the operational amplifier configuration.

The servo loop is applied to circuitry, disclosed in the above-referenced patent application, comprising capacitors and electronic switches. One capacitor and switch, designated as the input capacitor and input reset switch, are disposed in the input signal path. The remainder of the circuitry comprises a feedback capacitor, feedback shunt switch and feedback reset switch disposed in the feedback path between the feedback input and output terminals of the operational amplifier.

The input and output of the servo loop are respectively connected to the output of the operational amplifier and to a preselected input terminal. Circuitry within the servo loop generates an error correction voltage to compensate for differential charges produced across the operational amplifier input terminals by operation of the input reset and feedback shunt switches as well as the finite gain of the operational amplifier. The polarity of the error correction voltage is determined by periodically sampling the output of the operational amplifier.

To compensate for input offset voltage, the signal input terminal of the operational amplifier is grounded or nulled at preselected intervals by closure of the input reset switch. The feedback capacitor is then charged toward the input offset voltage upon operation of the feedback shunt and feedback reset switches. These switches respectively shunt one side of the feedback capacitor from the feedback loop and ground the second side of the feedback capacitor. Finally, the error correction voltage is applied to a predetermined input terminal.

An aspect of the present invention is its suitability for high speed, low voltage comparators.

A further aspect of the present invention is its applicability to integrated circuit technology.

DETAILED DESCRIPTION

Figure 1:
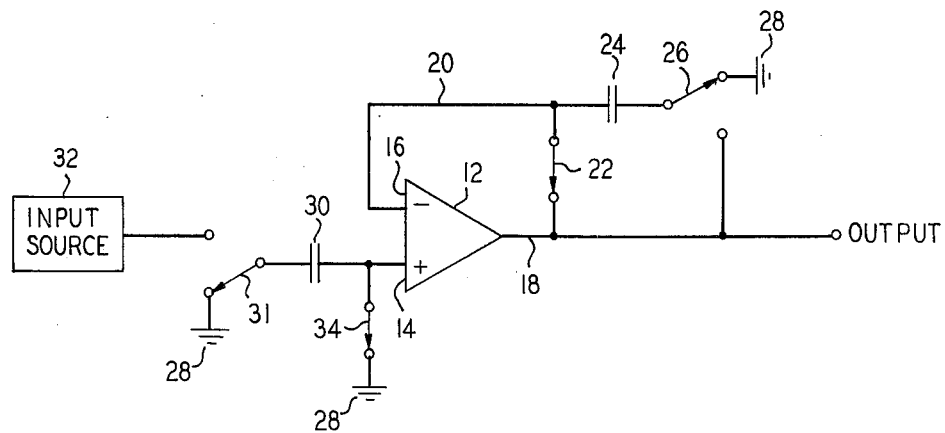
FIGs. 1 and 2 show the input offset voltage compensation circuitry to which the present invention pertains.
Figure 2:
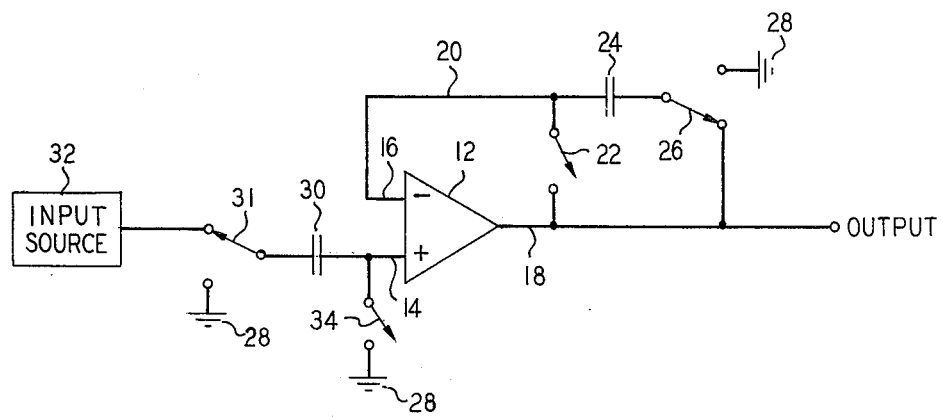

FIGS. 1 and 2 show the circuitry, disclosed in the above-referenced patent application, to which the present invention is applied. As illustrated, finite gain operational amplifier 12 has a signal input terminal 14, a feedback input terminal 16 and an output terminal 18. Compensation for the input offset voltage of operational amplifier 12 is achieved through the use of switches and capacitors. In the preferred embodiment these switches are MOSFET (metal-oxide-silicon-field-effect-transistors) devices. For purpose of simplicity, however, these switches are illustratively represented in the Figures as mechanical switches.

Input signal source switch 31, input capacitor 30 and input reset switch 34 are disposed in the input signal path between input signal source 32 and input signal terminal 14. Input capacitor 30 is connected between the signal input terminal 14 and double throw signal source switch 31. Signal source switch 31 can selectively connect input capacitor 30 to reference potential 28, such as ground potential, or to signal input source 32. Input reset switch 34, located between input signal terminal 14 and input capacitor 30, is a single pole switch which, when closed, connects input signal terminal 14 directly to reference potential 28.

Feedback shunt switch 22, feedback capacitor 24, and feedback reset switch 26 are interconnected to feedback loop 20 which connects feedback input terminal 16 and output terminal 18. For purposes of clarity, feedback loop 20 is the path from feedback input terminal 16 through feedback capacitor 24 and feedback reset switch 26, in the position shown in FIG. 2, to output terminal 18. Feedback capacitor 24 has a first side connected between feedback shunt switch 22 and feedback input terminal 16. Feedback shunt switch 22 is a single pole switch that shunts feedback capacitor 24 and directly couples feedback input terminal 16 to output terminal 18 when closed. Feedback reset switch 26, on the other hand, is a double throw switch that can selectively connect the second side of feedback capacitor 24 either to reference potential 28 or to output terminal 18.

Compensation for the input offset voltage of operational amplifier 12 is provided by sequential operation of the electronic switches which nulls the signal input 14 and charges feedback capacitor 24 with the voltage on output terminal 18. Due to the finite gain of operational amplifier 12, however, the voltage on output terminal 18 does not exactly equal input offset voltage and an error in compensation is created.

Figure 3:
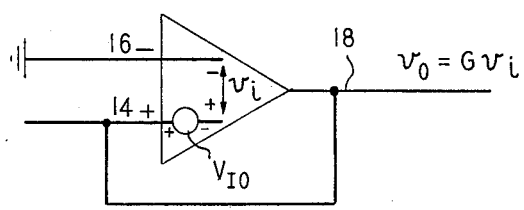
FIG. 3 shows an illustrative representation of an operational amplifier configured as in FIG. 1.

Refer now to FIG. 3 which illustrates an internal representation of operational 12 having finite gain G. Signal input terminal 16 is connected to ground and feedback input terminal 14 is connected to output terminal 18. The input offset voltage, $V_{IO}$, is represented as a constant voltage source serially connected to signal input lead 14. Voltage $v_i$ represents the internal voltage between input signal lead 14 and feedback input lead 16. The output voltage appearing on output terminal 18 is $v_o$, where $v_o = Gv_i$. Now according to Kirchhoff's law;

$$-V_{IO} = v_o + v_i = v_o + V_o/G. \tag{1}$$

Accordingly, $$v_o = (GV_{IO})/(1+G). \tag{2}$$

For low gain applications, such as high-speed comparators, the difference between $v_o$ and $V_{IO}$ caused by non-unity term $G/G+1$ becomes significant. This difference caused by the finite gain of the operational amplifier is hereinafter referred to as error $E_1$. Based on the foregoing, $$E_1 = (V_{IO})/(G+1). \tag{3}$$

As shown in FIG. 1, the nulling of input signal lead 14 and discharge of input capacitor 30 is provided by coupling input reset switch 34 and input signal source 31 to reference source 28. Use of input signal source switch 31 can be eliminated if the input source 32 voltage returns to reference potential 28 and the offset compensation can be synchronized with this return. Feedback capacitor 24 is now charged to the voltage $V_{IO} + E_1$ appearing on output terminal 18 by closing feedback shunt switch 22 and coupling feedback reset switch 26 to reference potential 28. FIG. 2 shows the switch states which follow the charging of feedback capacitor 24. Feedback shunt switch 22 is opened first followed by the opening of input reset switch 34. Finally, input source switch 31 and feedback reset switch 26 are respectively connected to input source 32 and output terminal 18.

It should be noted that input reset switch 34 and feedback shunt switch 22 are switching between low and infinite impedances. Consequently, when these switches are opened, an electrical charge is injected into input capacitor 30 and into feedback capacitor 24. While judicious setting of the capacitance ratio of input capacitor 30 to feedback capacitor 24 can reduce the difference between these electronic charges due to manufacturing mismatches, a difference nevertheless remains. Accordingly, the charge on feedback capacitor 24 is altered by an additional error term $E_2$ which represents the difference in electronic charges injected by switches 22 and 34. It should be noted that switches 26 and 31, however, do not inject any electronic charges as they switch between low impedance points.

Figure 4:
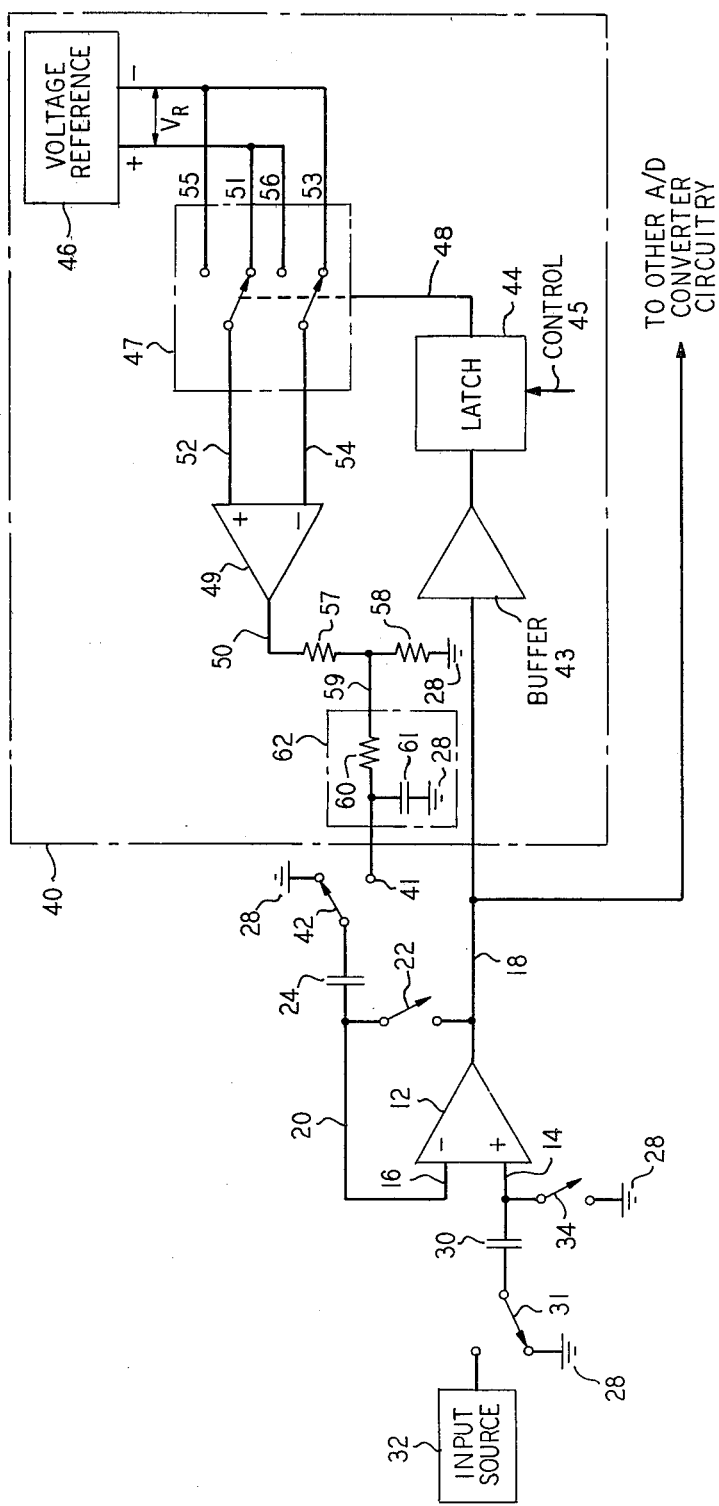
FIG. 4 shows a detailed circuit diagram of an embodiment of the present invention.

FIG. 4 shows servo loop 40 incorporated into the circuitry of FIGS. 1 and 2. Servo loop 40, connected between output 18 of operational amplifier 12 and node 41 of servo switch 42, generates an error correction voltage. This error correction voltage is periodically applied to feedback capacitor 24 to compensate for errors $E_1$ and $E_2$.

To generate the error correction voltage, output 18 is supplied to buffer 43 and thence to latch 44. Latch 44 produces either a logical "0" or "1" signal upon the application of control signal 45. The state of the logic signal generated depends upon the polarity of the signal on output 18 when control signal 45 is applied. Specifically, a logical "1" signal is produced when the signal on output 18 is positive and a logical "0" signal is produced when the signal on output 18 is negative. Buffer 43 is used to prevent spurious transient signals produced when latch 44 strobed by control signal 45 from feeding back into operational amplifier 12.

The logical "0" or "1" signal produced by latch 44 controls double pole-double throw switch 47. This control function is represented by lead 48. Reference voltage $V_R$ produced by voltage reference source 46 is connected by switch 47 to difference amplifier 49 having unity gain. When the output of latch 44 is logical "1", switch 47, as depicted, connects lead 51 to 52 and lead 53 to 54 to generate a positive voltage at output 50. Alternatively, when a logical "0" is produced at the output of latch 44, switch 47 connects lead 55 to 52 and lead 56 to 54 thereby producing a negative voltage at output 50. Resistors 57 and 58 form a voltage divider which is connected to output 50 to attenuate the voltage thereon. The output voltage from the divider appears on lead 59 and is coupled through a low pass filter 62 comprising resistors 60 and capacitor 61 to node 41. The values of resistor 60 and capacitor 61 are selected so that the time constant of filter minimizes variations in the error correction voltage appearing on node 41 between offset voltage compensation operations.

The sequential operation of FIG. 4 circuitry will now be presented. The compensation sequence begins by coupling signal source switch 31 and input reset switch 34 to reference potential 28. This discharges input capacitor 30 and nulls input terminal 14. Feedback capacitor 24 is then charged to voltage $V_{IO}+E_1$ by closing feedback shunt switch 22 and connecting servo switch 42 to reference potential 28. Feedback shunt switch 22 is then opened followed shortly thereafter by the opening of input reset switch 34. The operation of switches 22 and 34, as discussed supra, varies the voltage on feedback capacitor 24 by term $E_2$. After the opening of feedback shunt switch 22, servo switch 42 is switched from reference potential 28 to node 41 and then the control signal 45 is applied to latch 44. As a result, an error correction voltage is generated within servo loop 40 and applied to feedback capacitor 24. The precise compensation of the input offset voltage of operational amplifier 12 is completed in a relatively small number of servo cycles and input signal 32 can be applied to input terminal 14 by closure of signal source switch 31.

The described circuitry and switching sequence illustrated in FIG. 4 has been used to reduce the input offset voltage of amplifier 12 to a level which is satisfactory for use as a comparator within a high speed A/D converter. The comparator advantageously can be zero set before each analog voltage sample. Prior to the use of servo loop 40, the residual offset was approximately 5 millivolts. This residual offset was reduced using a 3 volt reference voltage which was attenuated to ±20 millivolts by the voltage divider. The time constant of the low pass filter was 37.5 milliseconds.

It will, of course, be apparent to those skilled in the art that the circuitry of FIG. 4 can be varied without affecting the improvement in input offset voltage compensation. The polarity of the error correction voltage produced within servo loop 40, for example, can be inverted by simply reversing the logical signal output of latch 44. The voltage appearing on node 41 could then be applied to signal input terminal 14 and stored on input capacitor 30 by connecting node 41 to an additional switch position in either input reset switch 34 or signal source switch 31. Servo switch 42, like feedback reset switch 26, would then selectively connect feedback capacitor 24 to either reference potential 28 or output 18. It should be noted that these apparatus changes do not alter the offset compensation sequence, i.e., the correction voltage is applied after charging feedback capacitor 24.

We claim:

1. An amplifier (12) having a first input terminal (16), a second input terminal (14) for connection to an input signal source (32), an output terminal (18), and a feedback loop (20) connecting said first input terminal with said output terminal, the operating characteristics of the amplifier being such that input offset voltage compensation circuitry is required for obtaining the desired output terminal voltage, said circuitry comprising a first switch means (22) arranged to shunt said feedback loop when closed;
a first capacitor (24) connected at a first side between said first input terminal and said first means;
a second capacitor (30) connected at a first side to said second input terminal;
a second switch means (34) arranged to selectively connect said second input terminal to a reference potential (28);
a third switch means (26) connected on one side to the second side of said first capacitor and arranged to selectively connect second side of said first capacitor either to said reference potential or to said output terminal of said operational amplifier and said circuitry being further characterized by
means (43, 44, 45) for sampling the output of said amplifier at preselected intervals; and
means (46, 47, 49, 57, 58, 60, 61) responsive to the polarity of said sampled signal for generating an error correction voltage having a magnitude equal to the differential charge produced across said first and second input terminals by the finite gain of said amplifier and the operation of said first and second means, said error correction voltage compensating for said differential charge when applied to a preselected one of said input terminals.

2. An amplifier (12) having a first input terminal (16), a second input terminal (14) for connection to an input signal source (32), an output terminal (18), and a feedback loop (20) connecting said first input terminal with said output terminal, the operating characteristics of the amplifier being such that input offset voltage compensation circuitry is required for obtaining desired output terminal voltage, said circuitry comprising a first switch means (22) arranged to shunt said feedback loop when closed;
a first capacitor (24) connected at a first side between said first input terminal and said first means;
a second capacitor (30) connected at a first side to said second input terminal;
a second switch means (34) arranged to selectively connect said second input terminal to a reference potential (28) and said circuitry being further characterized by
means for sampling (43, 44, 45) the output of said amplifier at preselected intervals;
means for generating (46, 47, 49, 57, 58, 60, 61) an error correction voltage equal in magnitude to the differential charge produced across said first and second input terminals by operation of said first and second means and the finite gain of said amplifier, the polarity of said error correction voltage being equal to the sampled amplifier output; and
third switch means (42) connected on one side to the second side of said first capacitor and arranged to selectively connect said second side of said first capacitor either to said reference potential or to the output of the generating means.

3. The amplifier apparatus of claim 1 wherein said first, second and third switch means are electronic switching devices.

4. The amplifier apparatus of claim 2 wherein said first, second and third switch means are electronic switching devices.

5. The amplifier apparatus of claims 3 or 4 wherein said electronic switching devices are metal-oxide-silicon-field-effect-transistors.

6. A method of compensating for the input offset voltage of an amplifier (12) having a signal input terminal (14) with an input capacitor (30) in series therewith, a feedback input terminal (16), an output terminal (18), and a feeback capacitor (24) serially disposed in a feedback loop (20) connecting said feedback and output terminals, comprising the steps of:

connecting said signal input terminal and input capacitor to a reference potential (28) by closing an input reset switch (34) to generate a voltage on said output terminal approximately equal to said input offset voltage;

applying said voltage to a side of said feedback capacitor by closing a feedback shunt switch (22) while connecting a second side of said feedback capacitor to said reference potential by closing a feedback reset switch (26);

disconnecting said voltage from said feedback capacitor by opening said feedback shunt switch;

disconnecting said reference potential from said second side of said feedback capacitor by opening said feedback reset switch;

disconnecting said reference potential from said signal input terminal and input capacitor by opening said input reset switch; and being characterized by the steps of sampling the voltage on said output terminal, and generating an error correction voltage responsive to said sampled voltage having a magnitude equal to the differential charge produced across said signal input and feedback input terminals by the finite gain of said amplifier and the operation of said feedback shunt and input reset switches, said error correction voltage compensating for said differential charges when applied to a preselected one of said input terminals.

7. A method of compensating for the input offset voltage of an amplifier (12) having a signal input terminal (14) with an input capacitor (30) in series therewith, a feedback input terminal (16), an output terminal (18), and a feedback capacitor (24) serially disposed in a feedback loop (20) connecting said feedback and output terminals, comprising the steps of:

connecting said signal input terminal and input capacitor to a reference potential (28) by closing an input reset switch (34) to generate a voltage on said output terminal approximately equal to said input offset voltage;

applying said voltage to a side of said feedback capacitor by closing a feedback shunt switch (22) while connecting a second side of said feedback capacitor to said reference potential by switching a servo switch (42);

disconnecting said voltage from said feedback capacitor by opening said feedback shunt switch;

disconnecting said reference potential from said signal input terminal and input capacitor by opening said input reset switch; and being characterized by the steps of sampling the voltage on said output terminal;

generating an error correction voltage responsive to said sampled voltage having a magnitude equal to the differential charge produced across said signal input and feedback input terminals by the finite gain of said amplifier and the operation of said feedback shunt and input reset switches, and applying said error correction voltage to said second side of said feedback capacitor by switching said servo switch.

8. The method of claim 6 wherein said feedback shunt, input reset and feedback reset switches are electronic switching devices.

9. The method of claim 7 wherein said feedback shunt, input reset and feedback reset switches are electronic switching devices.

10. The method of claim 8 or 9 wherein said electronic switching devices are metal-oxide-silicon-field-effect transistors.

* * * * *